United States Patent [19]

Weinert et al.

[11] 4,292,608
[45] Sep. 29, 1981

[54] ELECTROACOUSTIC DELAY LINE APPARATUS

[75] Inventors: Robert W. Weinert, Monroeville; John de Klerk, Pittsburgh, both of Pa.

[73] Assignee: Westinghouse Electric Corp., Pittsburgh, Pa.

[21] Appl. No.: 61,089

[22] Filed: Jul. 26, 1979

[51] Int. Cl.³ .................... H03H 9/30; H03H 9/40
[52] U.S. Cl. ................................... 333/141; 333/149
[58] Field of Search ............................ 33/141–145; 310/313 R, 313 B

[56] References Cited

U.S. PATENT DOCUMENTS

| | | | |
|---|---|---|---|
| 3,293,557 | 12/1966 | Denton | 333/144 |
| 3,343,105 | 9/1967 | van der Paun | 333/147 |
| 3,401,360 | 9/1968 | Du Bois | 333/149 |
| 3,611,203 | 10/1971 | Cooper | 333/154 |
| 3,621,309 | 11/1971 | Yokoyama | 333/186 |
| 3,675,052 | 7/1972 | Lindsay et al. | 333/142 |
| 3,689,784 | 9/1972 | de Klerk | 333/154 |
| 3,769,615 | 10/1973 | de Klerk | 333/149 |
| 3,825,779 | 7/1974 | de Klerk | 333/149 |
| 3,836,876 | 9/1974 | Marshall | 333/151 |
| 3,846,722 | 11/1974 | de Klerk | 333/193 |
| 4,055,820 | 10/1977 | Solie | 333/153 |
| 4,117,424 | 9/1978 | Coldren | 333/152 |

*Primary Examiner*—Eli Lieberman
*Attorney, Agent, or Firm*—R. G. Brodahl

[57] ABSTRACT

An electroacoustic delay line apparatus is disclosed including an acoustic bulk wave generating transducer positioned at one end of a delay line, with a predetermined spacing being provided between the respective electrode elements of the transducer array, such that the acoustic energy radiation from the bulk wave transducers on the end of the delay line interfaces constructively for certain frequencies at selected positions on the sensor transducer surface of the delay line. Therefore each input signal frequency of the acoustic waves is translated into a desired position on the sensor transducer surface of the delay line. The elements of the transducer array are electrically phased such that any electrode element is phase shifted by $\pi$ radians relative to its nearest adjacent electrode element.

12 Claims, 12 Drawing Figures

CONSTRUCTIVE INTERFERENCE  DESTRUCTIVE INTERFERENCE  CONSTRUCTIVE INTERFERENCE

ELECTROACOUSTIC DELAY LINE APPARATUS

GOVERNMENT CONTRACT

The Government has rights in this invention pursuant to Contract No. F33615-76-C-1337 awarded by the Department of the Air Force.

CROSS REFERENCE TO RELATED APPLICATIONS

The invention covered by this patent application is related to the invention covered by a concurrently filed patent application Ser. No. 061,100, filed July 26, 1979 by J. de Klerk and entitled "Electroacoustic Delay Line apparatus", and which is assigned to the same assignee; the disclosure of that related patent application is incorporated herein by reference.

BACKGROUND OF THE INVENTION

This invention relates to electroacoustic delay line apparatus and more particularly to bulk mode acoustic delay devices. In the prior art it was known as disclosed in U.S. Pat. No. 3,401,360 to provide a multiple electrode element acoustic wave transducer applied to a delay line to enhance and direct energy in desired lobes of radiation. The spacing from top to bottom of the transducer and between the centers of adjacent electrode elements varied with the distance along the length of the array according to the function which it is desired to reproduce as the frequency versus delay characteristic in the provided output energy signal. The transducer comprised a thin piezoelectric member having located on one surface of that member a ladder-like electrode array of finger elements connected in parallel to one side of an input signal source and a common electrode located on the opposite surface of the piezoelectric member and connected to the other side of the input signal source. All of the ladder-like electrode elements in the array are at the same electrical potential and connected in parallel. This prior art transducer apparatus provided a sweeping of parallel acoustic rays that were not focused in relation to any given location on a surfae of the delay line.

SUMMARY OF THE INVENTION

In accordance with the present invention electroacoustic delay line apparatus including an array of bulk wave generating transducer electrode elements is provided at one end of a delay line. The generating transducer comprises a plurality of electrode elements, with each such electrode element being energized to be phase shifted from its adjacent electrode elements by $\pi$ radians. A variable spacing between those electrode elements of the generating transducer is established, with the respective spacing between each pair of adjacent electrode elements being selected in relation to the location of a sensing transducer provided on a second surface of that delay line. Acoustic radiation from the bulk wave generating transducer is constructively and destructively modified to be steered toward and focused on the sensing transducer in relation to the frequency of the applied input signal. In this way bulk acoustic waves are generated that can be focused to a desired location on a sensor transducer and steered by the frequency of the applied input signal, and this enables a greater utilization of the energy contained in the steered beam in a pulse compression filter.

DESCRIPTION OF THE PREFERRED EMBODIMENT

Figure 1:
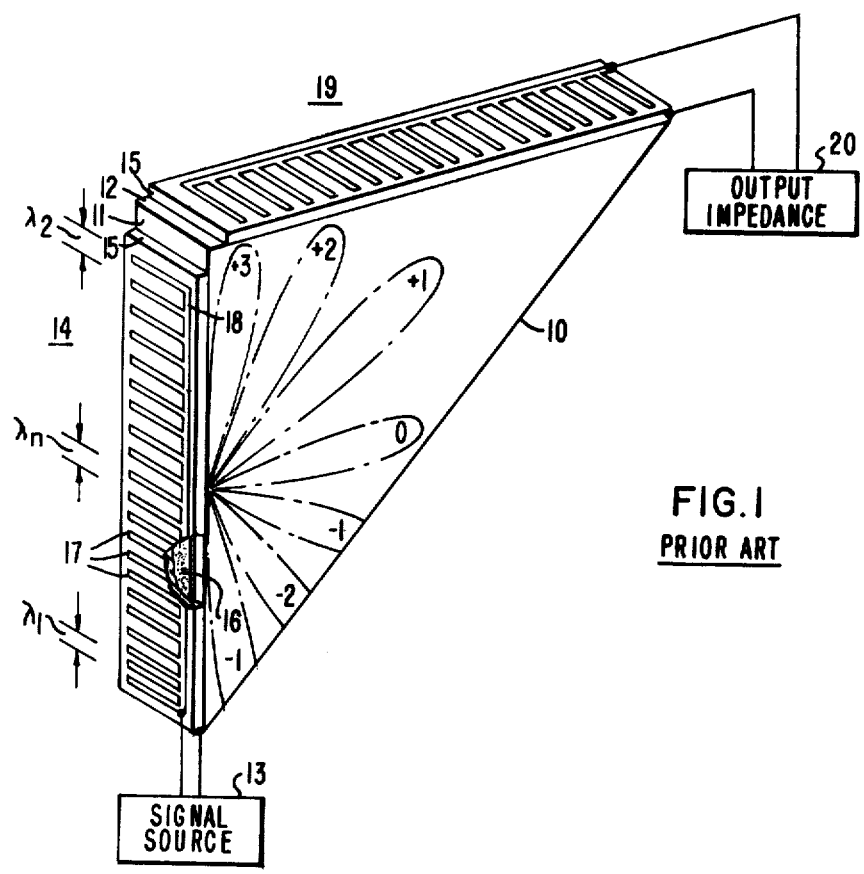
FIG. 1 shows a prior art acoustic wave transducer apparatus.

In FIG. 1 there is shown a prior art transducer apparatus as disclosed in U.S. Pat No. 3,401,360. Each of the signal generating transducer 14 and the signal sensing transducer 19 is similar to the other and includes a plurality of electrode elements, with the spacing from top to bottom being varied according to a frequency versus delay characteristic that is desired in the output signal from the transducer 19. The different frequency components of the input signal are radiated with different dispersion angles along paths having different path lengths. The similar output transducer 19 accepts the incident signals and combines the frequency component in a way which preserves the introduced delay.

Figure 2:
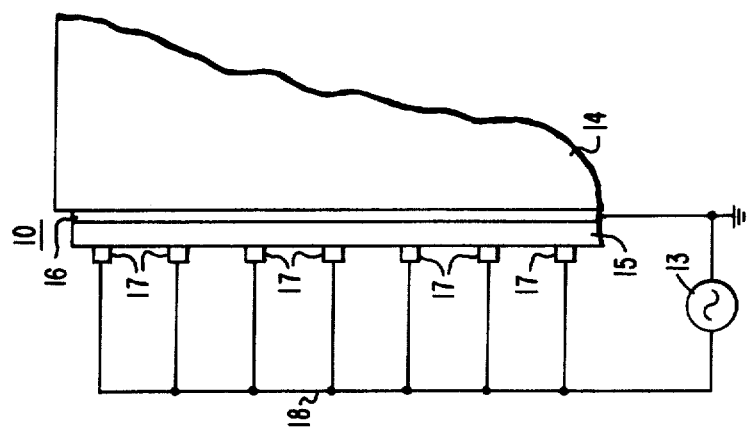
FIG. 2 shows the input signal relationships and the physical structure of the generating transducer of the prior art apparatus of FIG. 1.

FIG. 2 shows a block 10 of ultrasonic propagation material with the transducer 14 of FIG. 1 located on an end of the block 10 and including a piezoelectric member 15 positioned between a conductive common electrode 16 and a ladder-like array of electrode elements 17. The electrode elements 17 are electrically connected through a common rail connection 18 to one side of input signal source 13. The common electrode 16 is connected to the other side of the input signal source 13.

Figure 3:
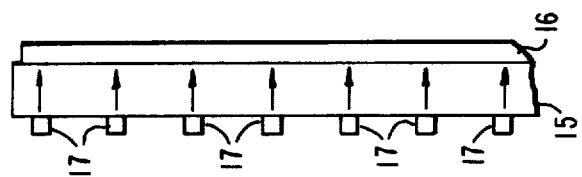
FIG. 3 shows the resulting electric fields in the piezoelectric member of the prior art apparatus of FIG. 1.

FIG. 3 shows the resulting electric field at one instant of time provided by energization of the electrode elements 17 of FIG. 1 all in phase and pointing toward the grounded common electrode 16.

Figure 4:
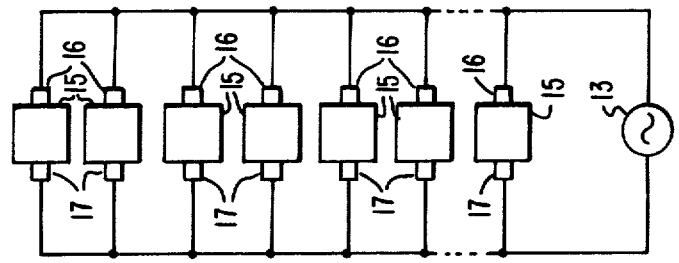
FIG. 4 shows the electrical parallel circuit connections of the electrode elements of the prior art apparatus of FIG. 1.

FIG. 4 shows the effective electrical parallel connection arrangement of each electrode element 17 through the piezoelectric member 15 to the common electrode 16 of FIG. 1.

Figure 5:
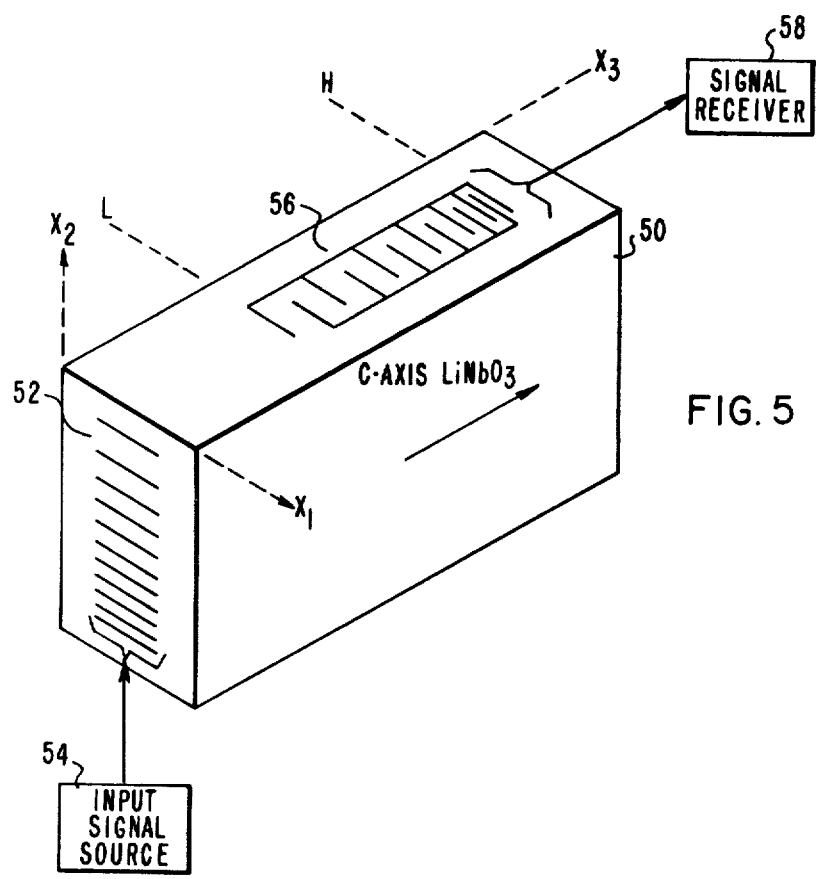
FIG. 5 shows the acoustic wave transducer apparatus of the present invention.

FIG. 5 shows the acoustic wave transducer apparatus of the present invention, including a beam steering bulk wave ZnO mosaic transducer 52 located at one end of the delay line 50 on the $X_1X_2$ surface of that delay line 50, and having electrode elements energized in a O, $\pi$, O, $\pi$ and so forth phase relationship in conjunction with a predetermined variable spacing, for generating bulk waves at the frequency of excitation between 1 GHz and 2 GHz, and with the direction of propagation of the bulk compressional wave being determined by the driving frequency of the input signal source 54. Those waves impinge on the $X_1X_3$ top surface which is substantially normal to the mosaic transducer $X_1X_2$ surface.

Figure 6:
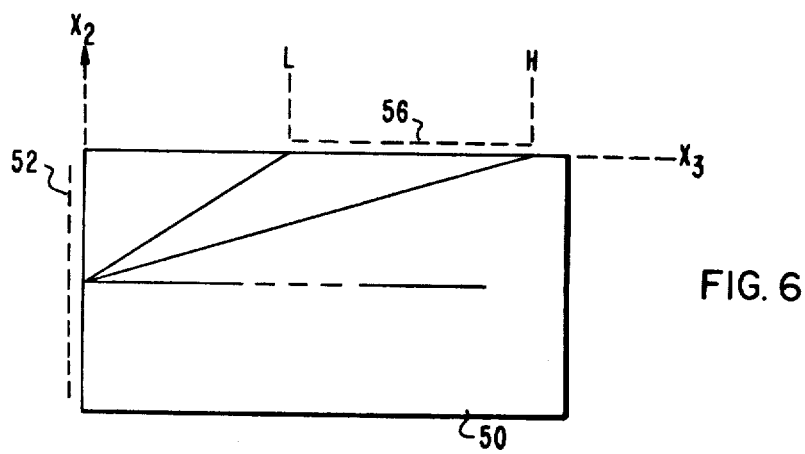
FIG. 6 shows the bulk wave energy impinging on the sensor transducer of the delay line of FIG. 5.

FIG. 6 shows the point of impact on the $X_1X_3$ surface as determined by the input signal frequency bandwidth, with the lowest frequency of 1 GHz impinging at the location L on the $X_1X_3$ surface and the highest frequency of 2 GHz impinging at the location H. A sensor transducer 56 placed on the $X_1X_3$ surface between points L and H detects the bulk waves arriving at the $X_1X_3$ surface and couples the sensed energy with an output signal receiver 58. The spacing between adjacent fingers of transducer 56 is gradually decreased from L to H in such a manner as to produce a linear change of the output signal with frequency.

The material chosen for the delay line 50 can be $LiNbO_3$, which is piezoelectric and belongs to crystal class 3m. The direction of propagation for a center frequency of 1.5 GHz is along the C-axis of the $LiNbO_3$ material of delay line 50, as shown in FIG. 5.

Figure 7:
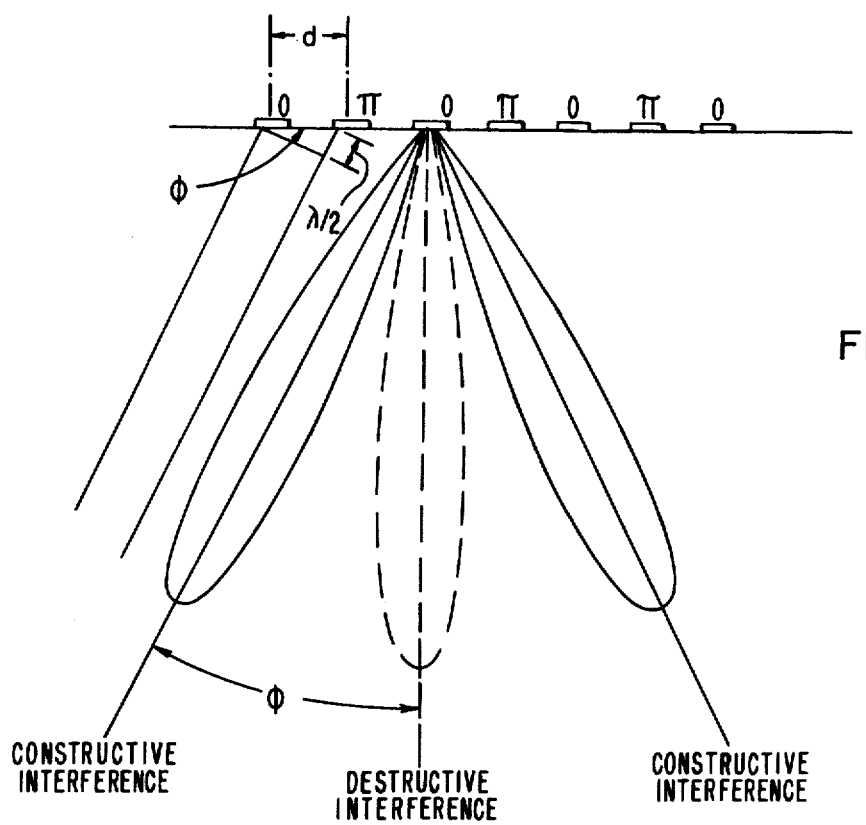
FIG. 7 illustrates the acoustic energy beam forming with 0 and $\pi$ phased radiators of FIG. 5.

FIG. 7 shows the resulting constructive and destructive interference patterns, for a O, $\pi$, O, $\pi$, phased transducer without variable spacing, which occur when the electrode elements of the generating transducer 52 of FIG. 5 are energized by the input signal source 54 such that the phases of the acoustic waves generated by adjacent elements of the mosaic transducer 52 are $\pi$ radians out of phase with one another. Under these conditions, destructive interference occurs between the main lobes and all of the energy is contained in the sidelobes, as indicated in FIG. 7. Constructive interference occurs at an angle $\phi$, such that the difference in path length between the two gratings is half an acoustic wavelength. The angle is determined by the acoustic wavelength and the separation d between the two diffraction gratings. As d is fixed for any fabricated grating structure, the value of $\phi$ will vary inversely to the frequency.

Figure 8:
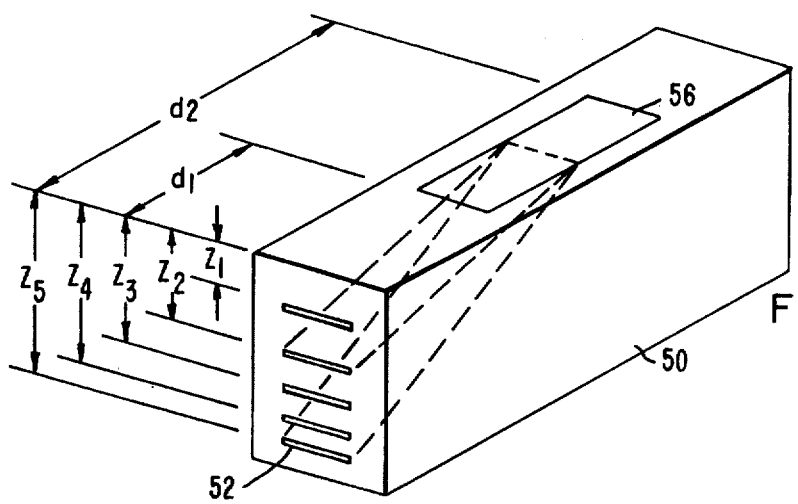
FIG. 8 shows the electrode element arrangement of the generating transducer of FIG. 5.

FIG. 8 shows the electrode element arrangement of the generating transducer 52 of FIG. 5 provided with variable spacing for the electrode elements. The purpose of this electrode element arrangement is to focus the energy generated by the O, $\pi$, O, $\pi$, mosaic transducer 52 to a line on the sensing surface, so that all the energy at any given frequency would be focused on the appropriate interdigital finger pair of the sensor transducer 56. This is shown schematically in FIG. 8. The dimensions of the system, that is, the $Z_s$ and $D_s$ of this Figure, can be adjusted such that the acoustic radiation from the bulk wave transducer 52 on the end of delay line 50 interferes constructively for certain frequencies at certain positions on the top surface of the crystal delay line 50 between $d_1$ and $d_2$. Hence, the frequency of the acoustic waves is translated into position on the delay line surface where the sensor transducer 56 is located.

Figure 9:
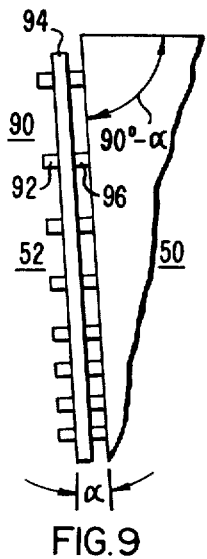
FIG. 9 shows the physical structure of the generating transducer of the apparatus shown in FIG. 5.

FIG. 9 shows the physical structure of the generating transducer 52 of FIG. 5. Each electrode element 90 includes a first finger 92 on one side of a piezoelectric layer 94 and a second cooperating finger 96 on the other side of the layer 94. The transducer 52 is oriented at an angle $\alpha$ in relation to the reference line 98, and which reference line 98 is at an angle of 90° in relation to the top $X_1X_3$ surface of the delay line 50.

Figure 10:
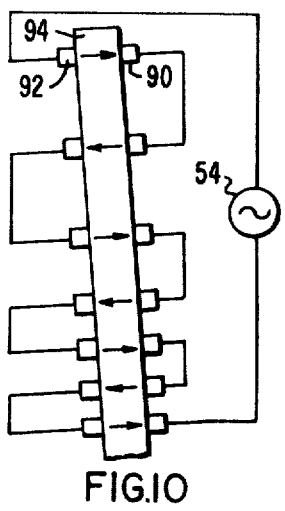
FIG. 10 shows the resulting electric fields in the piezoelectric member of the apparatus of FIG. 5.

FIG. 10 shows the resulting electric field at one instant of time for each electrode element 90 when the electrode elements are electrically connected in series in relation to the input signal source 54. The first finger 92 of each electrode element, such as 90 shown in FIG. 9, on one side of layer 94 and and the second finger 96 on the other side of layer 94 are all connected in series as shown in FIG. 10.

Figure 11:
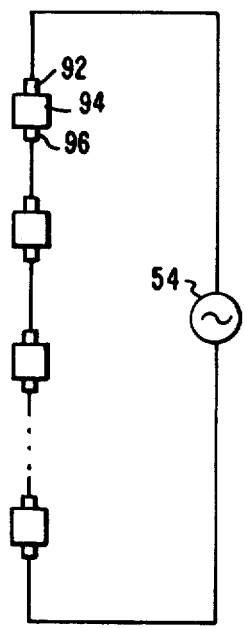
FIG. 11 shows the electrical series arrangement of the electrode elements of the apparatus of FIG. 5.

FIG. 11 shows the effective series circuit arrangement of the electrode elements as shown in FIG. 10, which enables improved coupling impedance matching in relation to the input signal source 54 as compared to the parallel circuit arrangement of the prior art electrode elements shown in FIG. 4. The impedance of each electrode element shown in FIG. 11 can be added together to provide a desired and better match with the coupling impedance of the input signal source 54. For example, if the coupling impedance of the input signal source is 10 ohms and the impedance of each electrode element 90 is 1/100 of an ohm, then by providing 1000 such electrode elements 90 the input impedance of the transducer 52 would then be a matching 10 ohms.

Figure 12:
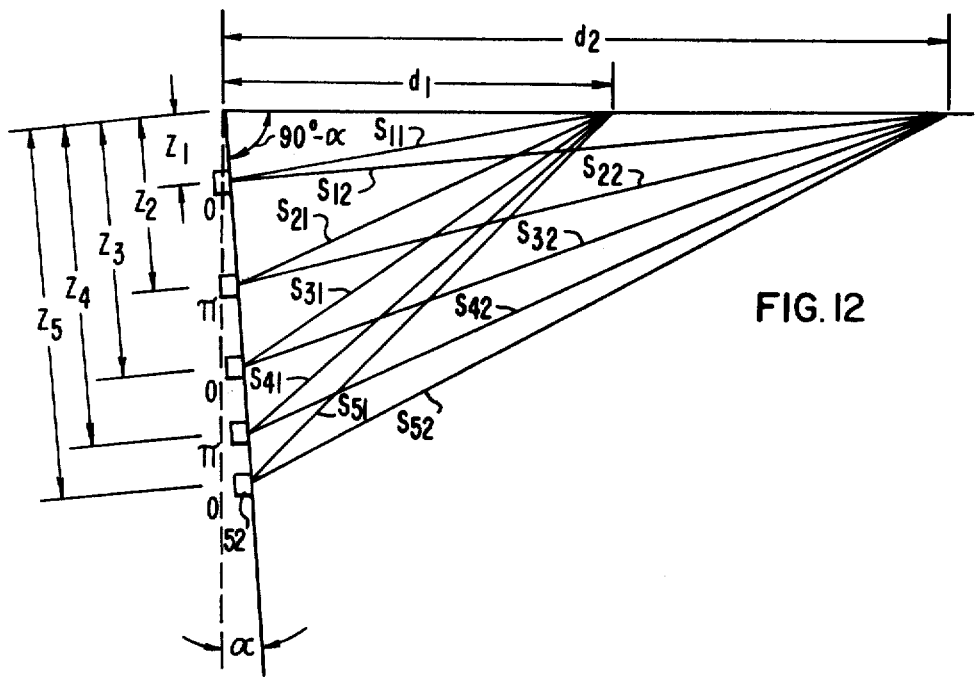
FIG. 12 shows the focusing of the acoustic energy rays provided with the apparatus of FIG. 5.

FIG. 12 shows the focusing of the acoustic energy rays provided by the apparatus of FIG. 5. The acoustic rays where the acoustic path lengths are respectively $S_{11}$, $S_{21}$, $S_{31}$, $S_{41}$ and $S_{51}$ that hit the $X_1X_3$ surface at $d_1$ are of a lower frequency and the acoustic rays $S_{12}$, $S_{22}$, $S_{32}$, $S_{42}$ and $S_{52}$ that hit the $X_1X_3$ surface at $d_2$ are of a higher frequency. The angle between the end $X_1X_2$ surface and the top $X_1X_3$ surface is labeled 90—$\alpha$ degrees, where $\alpha$ is chosen to adjust the dimensions of the delay line to achieve the desired linear delay as a function of frequency in relation to the delay line size or particular device specifications.

The general expression for constructive interference at the position (p) on the top $X_1X_3$ surface is $$S_{(i+1),p} - S_{i,p} = \left[ \frac{2N-1}{2} \right] \Lambda_p, \quad (1)$$

where the i labels refer to particular bulk wave transducer electrode elements, N is an integer and $\Lambda_p$ is the wavelength it is desired to detect at position (p). Constructive interference is accomplished when path lengths of adjacent acoustic rays differ by odd multiples of half wavelengths because of the O,$\pi$,O,$\pi$ phasing. To solve for the various Z dimensions, Equation (1) can be used with i=1 and p=1 and using the law of cosines, to give $$[Z_2^2 + d_1^2 - 2Z_2 d_1 \sin\alpha]^{\frac{1}{2}} - [Z_1^2 + d_1^2 - 2Z_1 d_1 \sin\alpha]^{\frac{1}{2}} = \left[ \frac{2N-1}{2} \right] \Lambda_1, \quad (2)$$

where $\Lambda_1$ is the acoustic wavelength at the low end of the frequency band of interest. For the high frequency end of the band, take i=1, p=2, yielding $$[Z_2^2 + d_2^2 - 2Z_2 d_2 \sin\alpha]^{\frac{1}{2}} - [Z_1^2 + d_2^2 - 2Z_1 d_2 \sin\alpha]^{\frac{1}{2}} = \left[ \frac{2M-1}{2} \right] \Lambda_2, \quad (3)$$

where M is an integer. To simplify the above expressions, take $\alpha = 0$ and approximate the lefthand side of the equation by expanding the square root function in powers of $(Z/d)^2$ and only retaining the first term. These simplifications yield $$Z_2^2 - Z_1^2 = (2N-1)d_1\Lambda_1 \qquad (4)$$

and $$Z_2^2 - Z_1^2 = (2M-1)d_2\Lambda_2. \qquad (5)$$

In the same way and proceeding down the array of bulk wave transducers for $N=1$, $$Z_3^2 - Z_2^2 = d_1\Lambda_1 \qquad (6)$$

$$Z_4^2 - Z_3^2 = d_1\Lambda_1. \qquad (7)$$

and so on. Therefore, once the bandwidth is chosen and one of the d's is chosen, a determination can be made for all of the Z's after $Z_1$ is selected.

For an illustrative example to show the above-determination of the practical variable spacing relationships of the electrode elements of a bulk wave transducer 52, assume the distances $Z_1$ equal 0.1 centimeter, $d_1$ equals 1 centimeter and $d_2$ equals 2 centimers. The distance $Z_2$ is determined by establishing the space difference $\Delta Z_{2,1}$ between the first and second electrode elements, the distance $Z_3$ is determined by establishing the space difference $\Delta Z_{3,2}$ between the second and third electrode elements, and so forth. In this manner, the following $\Delta Z$ values between successive pairs of adjacent transducer elements have been established using the relationship shown by above equations (6) and (7):

$$\Delta Z_{2,1} = 0.3597 \times 10^{-2} \text{ cm}$$

$$\Delta Z_{3,2} = 0.3465 \times 10^{-2} \text{ cm}$$

$$\Delta Z_{4,3} = 0.3357 \times 10^{-2} \text{ cm}$$

$$\Delta Z_{5,4} = 0.3258 \times 10^{-2} \text{ cm}$$

$$\Delta Z_{6,5} = 0.3267 \times 10^{-2} \text{ cm}$$

$$\Delta Z_{7,6} = 0.3084 \times 10^{-2} \text{ cm}$$

$$\Delta Z_{8,7} = 0.3005 \times 10^{-2} \text{ cm}$$

$$\Delta Z_{9,8} = 0.2935 \times 10^{-2} \text{ cm}$$

$$\Delta Z_{10,9} = 0.2868 \times 10^{-2} \text{ cm}$$

For accurate calculations of the values $Z_i$, alpha ($\alpha$) will not be set equal to zero but will be determined by the physical characteristics of the delay line material, and no approximations need to be made to calculate the Z's and d's. Even though the acoustic energy at one frequency reaches a particular position on the surface with a slight spread in delay time, the spread is small and is given by $$(\Delta \tau)_f = \frac{-1}{2f}, \qquad (8)$$

where B is the number of the bulk wave transducer elements and $\tau$ is the delay time. To achieve compressed pulses of width less than $(\Delta\tau)_f$ it is desired to change acoustic velocity as the direction changes, since the acoustic radiation from transducers further from the top surface travel further than from those close to the surface. If the acoustic velocity increased slightly for acoustic radiation coming from the farther sources, the narrower compressed pulses than indicated by Equation (8) could be achieved. This can be done by using an anisotropic material such as $LiNbO_3$ and selecting a suitable orientation which has the desired properties, such as $+41.5°$ rotated $LiNbO_3$.

The bulk wave transducer apparatus here disclosed is described in additional detail in a report AFAL-TR-78-19, Volume II, entitled "Acoustic Wave Compressive Delay Line", published in November 1978 by U.S. Air Force Avionics Laboratory, the disclosure of which is incorporated herein by reference.

There has been described an electroacoustic transducer apparatus which can correlate input signal frequency with a determined position along the sensor transducer surface of the delay line. A practical application of this apparatus can be as a real time spectrum analyzer, and another application can be as a signal pulse compressor.

The distance $d_1$ shown in FIG. 12 is selected in accordance with the lowest frequency component of the input signal and the distance $d_2$ is selected in accordance with the highest frequency component of the input signal applied to the input transducer 52. The required bandwidth between the lowest frequency to the highest frequency may be an octave bandwidth, and establishes the distance between $d_1$ and $d_2$. The distance $Z_1$ established in relation to the physical manufacture of the delay line 50 with the input transducer 52 fabricated on the $X_1X_2$ surface end of the delay line 50. The angle $\alpha$ is selected in accordance with the desired placement of the focused acoustic beam energy in relation to the selected location of the sensor transducer 56 on the $X_1X_3$ surface of the delay line 50.

We claim:

1. In electroacoustic apparatus for delaying an input signal having a known bandwidth of frequencies, the combination of a delay line made of acoustic wave propagating material and having a first surface and a second surface, a first transducer including a plurality of series connected electrode elements positioned on the first surface for generating acoustic wave energy toward the second surface, with each electrode element of the first transducer being energized to be phase shifted by $\pi$ radians in relation to the energization of the adjacent electrode elements of the first transducer, a second transducer positioned on the second surface for receiving the generated acoustic wave energy from the first surface, with the spacing between the successive pairs of adjacent electrode elements of the first transducer having a predetermined variation determined in relation to the acoustic wavelength $\Lambda_1$ at the low end of said bandwidth of frequencies of said input signal, the distance $Z_1$ of the first electrode element of the first transducer from the second surface and the distance $d_1$ of the second transducer from the first surface to provide constructive interference in the acoustic wave energy radiation from the first transducer toward the second transducer.

2. The electroacoustic apparatus of claim 1, with said predetermined variation being provided to focus the acoustic wave energy radiation from the first transducer onto the second transducer in accordance with the frequency of the input signal.

3. The electroacoustic apparatus of claim 1 operative with an input signal source having an impedance, with the plurality of electrode elements of the first transducer being electrically connected in series such that the impedance of each said electrode element is added together to provide a desired match with the input signal source impedance.

4. The electroacoustic apparatus of claim 1, with said predetermined variation in the spacing of the first transducer electrode elements being selected to focus the generated acoustic wave energy as a function of the bandwidth of frequencies of the applied input signal.

5. The electroacoustic apparatus of claim 1, with the second transducer being positioned on the second surface in a location determined by each of the lowest frequency and the highest frequency within said bandwidth of frequencies.

6. The electroacoustic apparatus of claim 1, with said predetermined variation being selected to correlate the input signal frequency with a determined position along the second transducer.

7. The electroacoustic apparatus of claim 1, with the spacing between each pair of electrode elements of the first transducer being selected in relation to the position of the second transducer on the second surface of the delay line.

8. In an electroacoustic delay apparatus for operation with a source of an input signal within a known bandwidth of frequencies, the combination of
   a delay line having a first surface and a second surface,
   a generating transducer positioned on said first surface and responsive to said input signal for providing acoustic radiation within the delay line, said generating transducer having a plurality of series connected electrode elements, with each one of said electrode elements being energized in a predetermined $\pi$ radians out-of-phase relationship to the electrode elements adjacent to said one electrode element,
   a receiving transducer positioned on said second surface, and
   with the spacing between each pair of electrode elements of the generating transducer being selected in accordance with the position of the receiving transducer on said second surface and with an angle of 90° minus $\alpha$ being provided between the first surface and the second surface where $\alpha$ is selected to provide a desired placement of the provided acoustic radiation within the delay line in relation to the receiving transducer.

9. The electroacoustic delay apparatus of claim 8, with the spacing between said electrode elements of the generating transducer being operative in relation to the frequency of the input signal within said bandwidth of frequencies to steer acoustic radiation from the generating transducer toward the receiving transducer.

10. The electroacoustic delay apparatus of claim 8, with the spacing selection for the electrode elements of the generating transducer in relation to the frequency of the input signal being operative to focus the acoustic radiation from the generating transducer to a desired location on the receiving transducer.

11. The electroacoustic delay apparatus of claim 8, with said input signal source having a known impendance and
   with the electrode elements of the generating transducer being electrically connected in series to provide a desired impedance match with the input signal source.

12. The electroacoustic delay apparatus of claim 8, with the electrode elements of the generating transducer being spaced in relation to the known bandwidth of frequencies of the input signal to direct the acoustic radiation toward a predetermined portion of the second transducer for each of the frequencies of the input signal.

* * * * *